(12) United States Patent
Abe et al.

(10) Patent No.: US 10,278,245 B2
(45) Date of Patent: Apr. 30, 2019

(54) LIGHT-EMITTING DEVICE AND ILLUMINATION APPARATUS

(71) Applicant: PANASONIC INTELLECTUAL PROPERTY MANAGEMENT CO., LTD., Osaka (JP)

(72) Inventors: Masumi Abe, Osaka (JP); Yasuharu Ueno, Osaka (JP); Koji Omura, Osaka (JP); Kenji Sugiura, Osaka (JP); Toshifumi Ogata, Osaka (JP); Atsuyoshi Ishimori, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 257 days.

(21) Appl. No.: 15/055,937

(22) Filed: Feb. 29, 2016

(65) Prior Publication Data
US 2016/0265748 A1 Sep. 15, 2016

(30) Foreign Application Priority Data
Mar. 11, 2015 (JP) .................................. 2015-048546

(51) Int. Cl.
*H05B 33/08* (2006.01)
*F21S 8/02* (2006.01)
(Continued)

(52) U.S. Cl.
CPC .......... *H05B 33/0821* (2013.01); *F21S 8/026* (2013.01); *F21Y 2105/18* (2016.08);
(Continued)

(58) Field of Classification Search
CPC ....... F21Y 2105/18; H01L 2224/48137; H05B 33/0821
See application file for complete search history.

(56) References Cited

U.S. PATENT DOCUMENTS 8,791,642 B2 * 7/2014 van de Ven ........ H05B 33/0824
315/192
8,820,950 B2 9/2014 Matsuda et al.
(Continued)

FOREIGN PATENT DOCUMENTS

JP 2011-216868 10/2011

*Primary Examiner* — Zheng Song
(74) *Attorney, Agent, or Firm* — Greenblum & Bernstein, P.L.C.

(57) ABSTRACT

A light-emitting device includes a substrate and a plurality of light-emitting elements disposed above the substrate. In the plurality of light-emitting elements, a first light-emitting element and a second light-emitting element different in a rate of decrease in light output along with a temperature increase are included. The plurality of light-emitting elements include: a first serial element group including some light-emitting elements connected in series among the plurality of light-emitting elements; and a second serial element group connected in parallel with the first serial element group and including some light-emitting elements connected in series among the plurality of light-emitting elements. A ratio between a total number of first light-emitting elements and a total number of second light-emitting elements is different between the first serial element group and the second serial element group.

6 Claims, 13 Drawing Sheets

(51) Int. Cl.
  *F21Y 115/10*      (2016.01)
  *F21Y 113/10*      (2016.01)
  *F21Y 105/18*      (2016.01)
  *H01L 25/075*      (2006.01)

(52) U.S. Cl.
  CPC ........ *F21Y 2113/10* (2016.08); *F21Y 2115/10* (2016.08); *H01L 25/0753* (2013.01); *H01L 2224/48463* (2013.01); *H01L 2924/181* (2013.01)

(56) References Cited

U.S. PATENT DOCUMENTS

| | | |
|---|---|---|
| 9,196,584 B2 | 11/2015 | Ogata et al. |
| 2005/0281027 A1* | 12/2005 | Capen .................... A01G 7/045 362/231 |
| 2009/0152572 A1* | 6/2009 | Su ............................ F21K 9/00 257/89 |
| 2011/0222264 A1* | 9/2011 | Matsuda .................. F21K 9/00 362/84 |
| 2013/0258636 A1* | 10/2013 | Rettke ................ H01L 25/0753 362/84 |
| 2014/0247597 A1* | 9/2014 | Abe .................. H05B 33/0821 362/249.06 |
| 2015/0176820 A1 | 6/2015 | Abe et al. |

\* cited by examiner

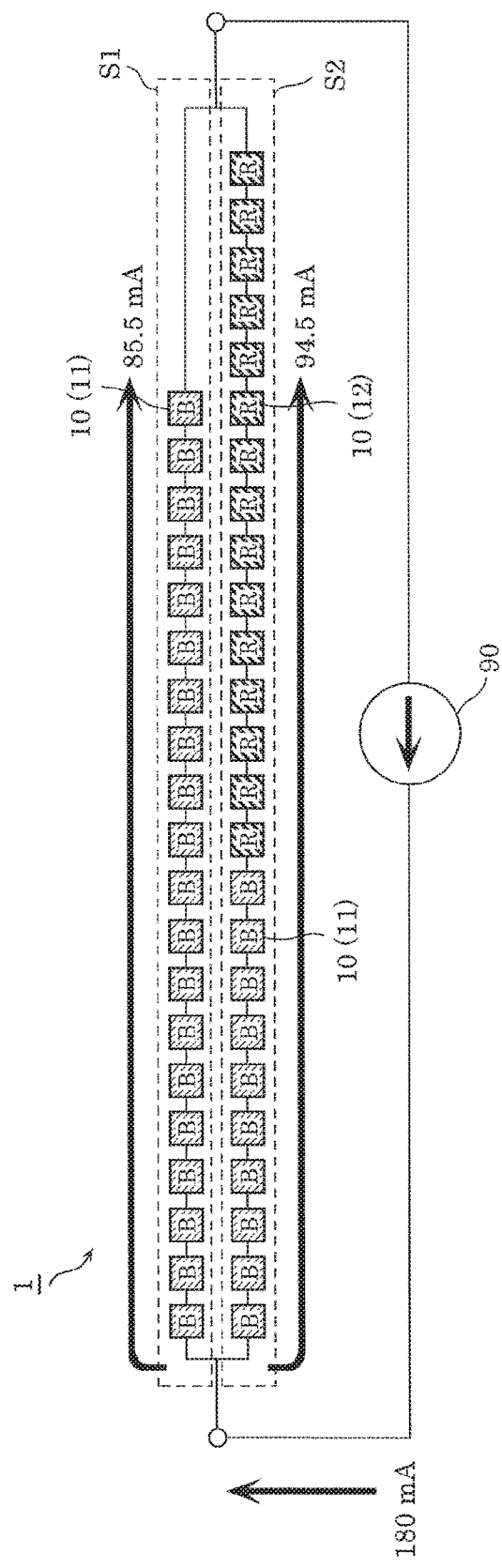

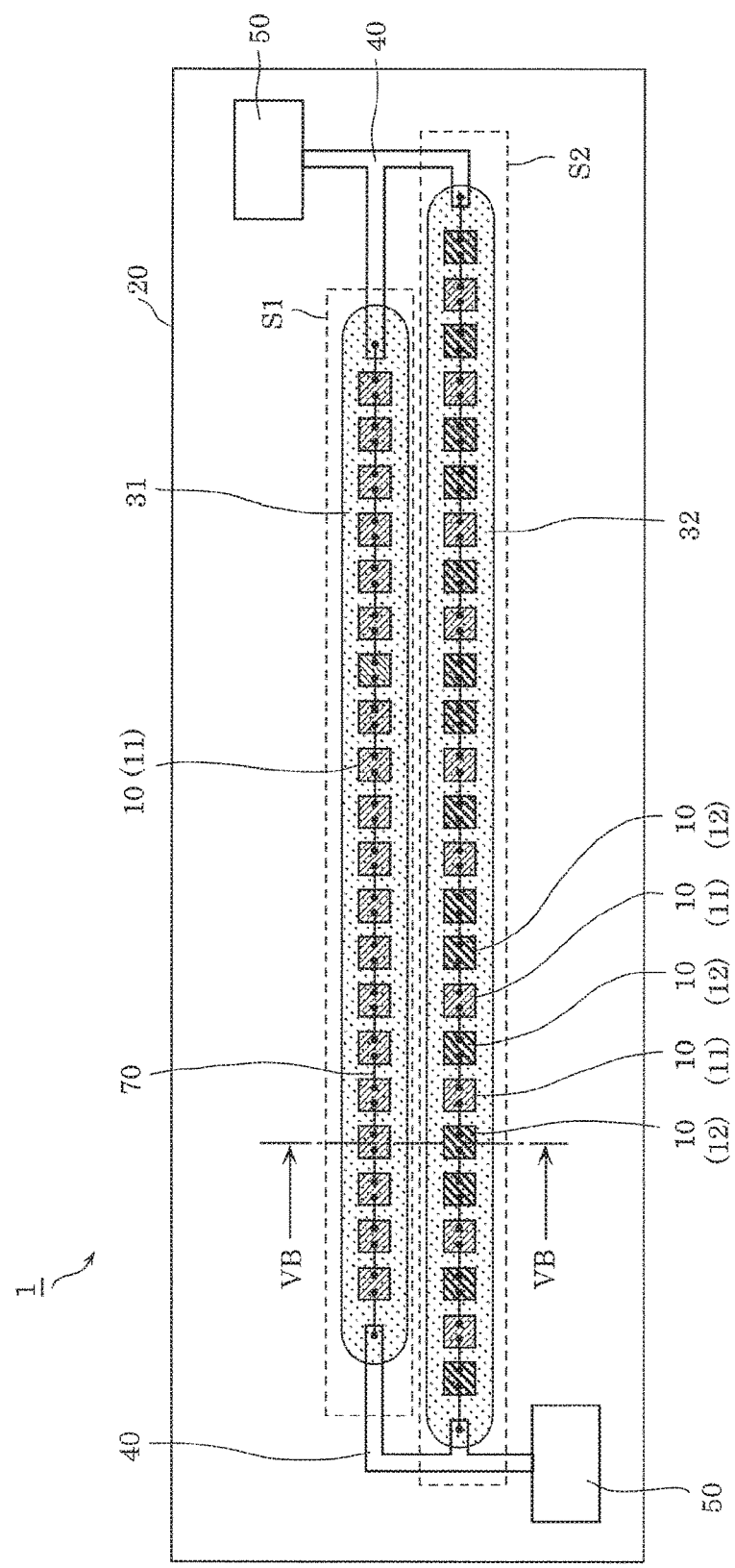

LIGHT-EMITTING DEVICE AND ILLUMINATION APPARATUS

CROSS REFERENCE TO RELATED APPLICATION

This application claims the benefit of priority of Japanese Patent Application Number 2015-048546 filed on Mar. 11, 2015, the entire content of which is hereby incorporated by reference.

BACKGROUND

1. Technical Field

The present disclosure relates to a light-emitting device and an illumination apparatus including the light-emitting device.

2. Description of the Related Art

Since semiconductor light-emitting elements such as LEDs (light emitting diodes) are small, efficient, and have a long lifespan, they show promise as light sources for various products for lighting purposes, display purposes, and so on.

LEDs are used, for example, in LED lamps as a light source for lighting purposes. Examples of LED lamps include bulb-shaped LED lamps (LED bulbs) as an alternative for bulb-shaped fluorescent and incandescent lamps, and straight tube LED lamps as an alternative for straight tube fluorescent lamps. Furthermore, LEDs are used, for example, in LED lighting fixtures which are an alternative for highly directional lighting fixtures such as a recessed light or a spotlight used in shops and the like.

In LED lamps and LED lighting fixtures, LEDs are embedded as a unit in the form of an LED module (a light-emitting device) that emits light of a predetermined color, such as white light.

For example, an LED module for use in bulb-shaped LED lamps and straight tube LED lamps is configured to generate white light with the use of a blue LED chip which emits blue light and a yellow phosphor which emits fluorescence by using the blue light emitted by the blue LED chip.

The amount of a red component contained in white light emitted by such an LED module is small, meaning that the LED module has poor color rendering properties. Therefore, a method of supplementing the above-stated LED module with a red component has been proposed in which a red phosphor that emits fluorescence by using blue light is added to the LED module.

However, the light emission efficiency of the LED module is reduced due to low energy conversion efficiency of the red phosphor. In view of this, instead of adding the red phosphor, a technique of adding a red LED chip which emits red light to improve the color rendering properties is being considered.

For example, Patent Literature 1 (Japanese Unexamined Patent Application Publication No. 2011-216868) discloses an LED module that includes a blue LED chip, a red LED chip, and a yellow phosphor. According to this disclosure, the LED module emits white light with excellent color rendering properties.

SUMMARY

However, the blue LED chip and the red LED chip are different in the rate of decrease in light output with respect to temperature variations, that is, they have different temperature properties. Therefore, in the LED module including the red LED chip and the blue LED chip, a difference in chromaticity increases as time passes after power ON (after the start of lighting).

Thus, an LED module including two or more types of light-emitting elements different in the rate of decrease in light output with respect to temperature variations has a problem that a difference in chromaticity (a color shift) occurs.

The present disclosure has been conceived to solve the problem described above, and provides a light-emitting device and an illumination apparatus that are capable of reducing a difference in chromaticity.

A light-emitting device according to an aspect of the present disclosure includes: a substrate; and a plurality of light-emitting elements disposed above the substrate, wherein a first light-emitting element and a second light-emitting element which are different in a rate of decrease in light output along with a temperature increase are included in the plurality of light-emitting elements, the plurality of light-emitting elements include: a first serial element group including some light-emitting elements connected in series among the plurality of light-emitting elements; and a second serial element group connected in parallel with the first serial element group and including some light-emitting elements connected in series among the plurality of light-emitting elements, and a ratio between a total number of the first light-emitting elements and a total number of the second light-emitting elements is different between the first serial element group and the second serial element group.

According to the present disclosure, a difference in chromaticity can be reduced.

BRIEF DESCRIPTION OF DRAWINGS

The figures depict one or more implementations in accordance with the present teaching, by way of examples only, not by way of limitations. In the figures, like reference numerals refer to the same or similar elements.

FIG. 4 illustrates an operation performed by a light-emitting device according to Embodiment 1;

FIG. 5A is a plan view illustrating a specific example of a light-emitting device according to Embodiment 1;

DETAILED DESCRIPTION OF THE EMBODIMENTS

Hereinafter, embodiments in the present disclosure are described with reference to the Drawings. Note that each of the embodiments described below shows a preferred specific example of the present disclosure. Therefore, the numerical values, shapes, materials, structural elements, and arrangement and connection of the structural elements, steps, the processing order of the steps, etc., shown in the following embodiments are mere examples, and are not intended to limit the present disclosure. Consequently, among the structural elements in the following embodiments, structural elements not recited in any one of the independent claims which indicate the broadest concepts of the present disclosure are described as arbitrary structural elements.

Note that the respective figures are schematic diagrams and are not necessarily precise illustrations. Additionally, substantially the same structural elements in the figures share the same reference signs, and description that would overlap may be omitted or simplified.

Embodiment 1

Structure of Light-Emitting Device

Figure 1:
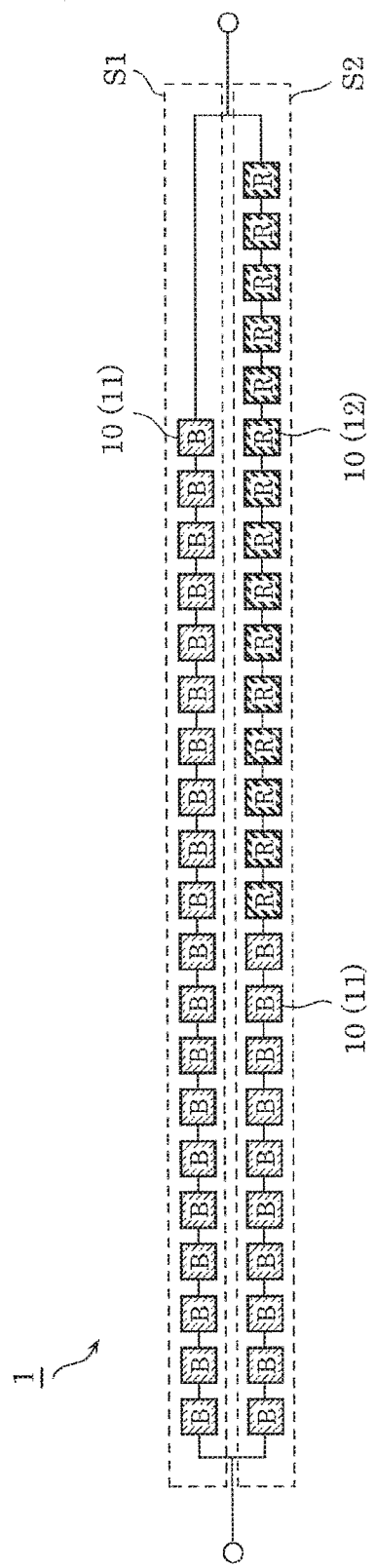
FIG. 1 illustrates a basic structure of a light-emitting device according to Embodiment 1.

First, a basic structure of light-emitting device 1 according to Embodiment 1 is described with reference to FIG. 1. FIG. 1 illustrates a basic structure of a light-emitting device according to Embodiment 1.

As illustrated in FIG. 1, light-emitting device 1 includes plural light-emitting elements 10. Plural light-emitting elements 10 include first light-emitting element 11 and second light-emitting element 12 which have different emission peak wavelengths. As an example, first light-emitting element 11 is a blue LED chip that emits blue light, and second light-emitting element 12 is a red LED chip that emits red light.

In the present embodiment, 30 first light-emitting elements (blue LED chips) and 15 second light-emitting elements (red LED chips) are used; thus, 45 light-emitting elements 10 in total are used.

Plural light-emitting elements 10 include: first serial element group S1 which includes some light-emitting elements connected in series among plural light-emitting elements 10; and second serial element group S2 connected in parallel with first serial element group S1 and including some light-emitting elements connected in series among plural light-emitting elements 10. In other words, first serial element group S1 and second serial element group S2 constitute a parallel circuit.

Two or more first light-emitting elements 11 are included in first serial element group S1. In the present embodiment, among first light-emitting elements 11 and second light-emitting elements 12, only first light-emitting elements 11 are included in first serial element group S1. Specifically, 20 first light-emitting elements 11 are connected in series in first serial element group S1. In other words, first light-emitting elements 11 and second light-emitting elements 12 are included at a ratio of 20 to zero in first serial element group S1.

Two or more first light-emitting elements 11 and two or more second light-emitting elements 12 are included in second serial element group S2. Specifically, 10 first light-emitting elements 11 and 15 second light-emitting elements 12 are connected in series in second serial element group S2. In short, 25 light-emitting elements are connected in series. Thus, first light-emitting elements 11 and second light-emitting elements 12 are included at a ratio of 2 to 3 in second serial element group S2.

In light-emitting device 1 thus structured, a ratio between a total number of first light-emitting elements 11 and a total number of second light-emitting elements 12 is different between first serial element group S1 and second serial element group S2. In other words, the ratio between first light-emitting elements 11 and second light-emitting elements 12 included in first serial element group S1 is different from the ratio between first light-emitting elements 11 and second light-emitting elements 12 included in second serial element group S2.

In the present embodiment, a total number of light-emitting elements 10 belonging to second serial element group S2 is greater than a total number of light-emitting elements 10 belonging to first serial element group S1. Specifically, the total number of light-emitting elements 10 belonging to first serial element group S1 is 20, and the total number of light-emitting elements 10 belonging to second serial element group S2 is 25.

Operation of Light-Emitting Device

Next, an operation of light-emitting device 1 according to the present embodiment is described.

Figure 2A:
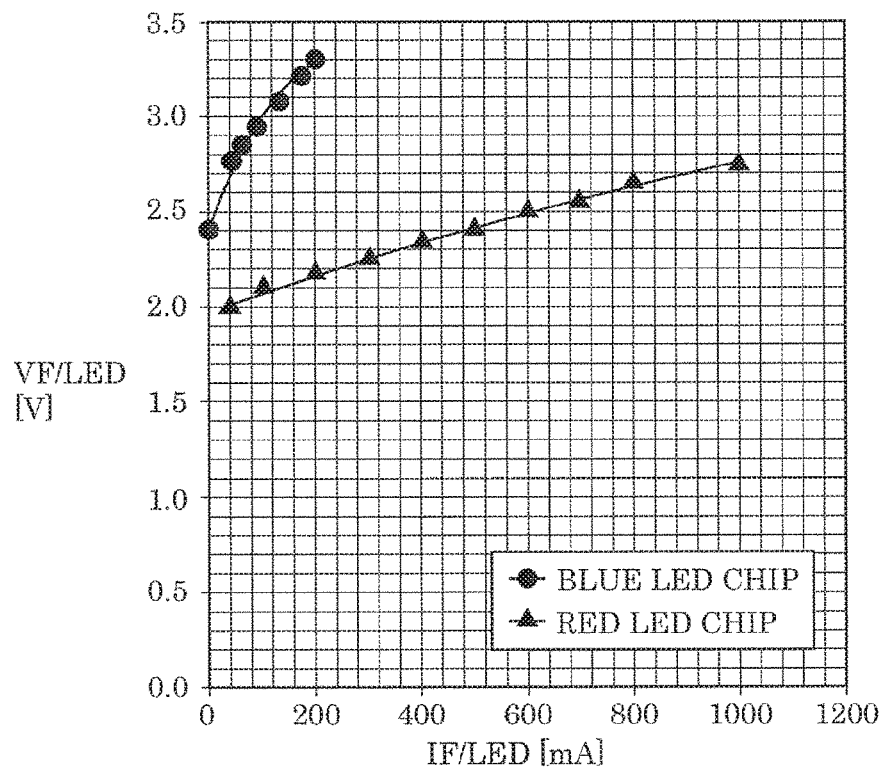
FIG. 2A illustrates IF-VF properties of a blue LED chip and a red LED chip used in a light-emitting device according to Embodiment 1.
Figure 2B:
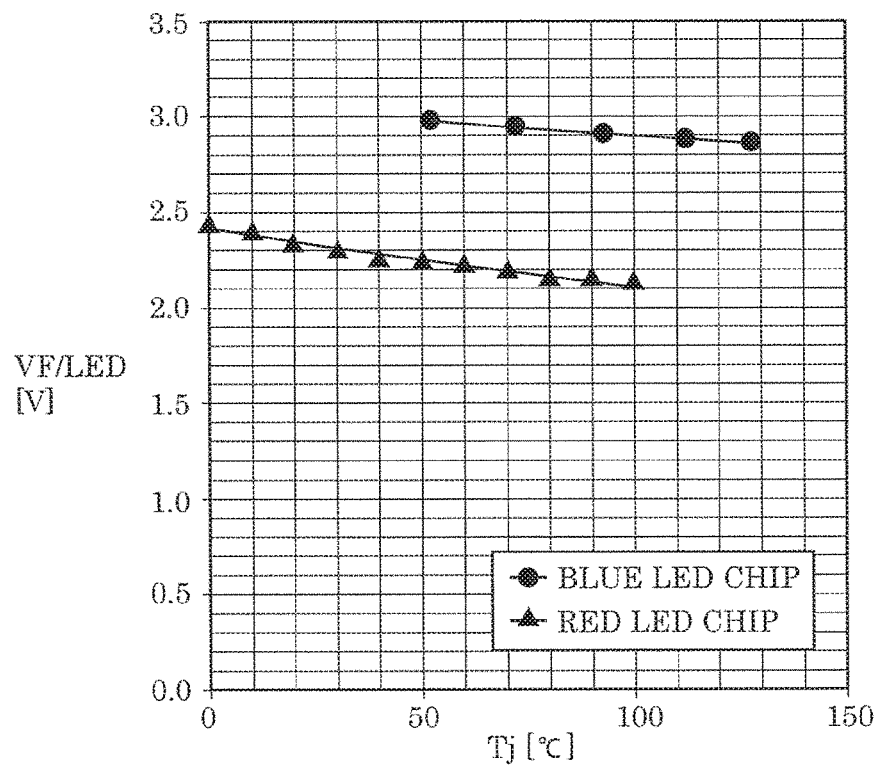
FIG. 2B illustrates temperature-VF properties of a blue LED chip and a red LED chip used in a light-emitting device according to Embodiment 1.
Figure 2C:
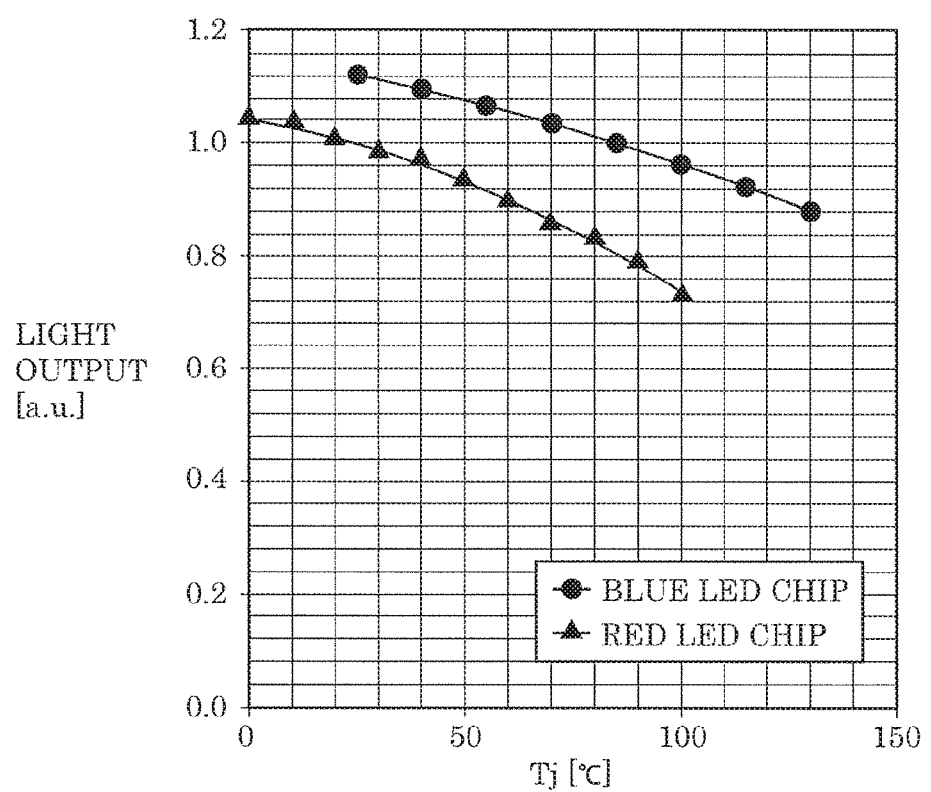
FIG. 2C illustrates temperature-light output properties of a blue LED chip and a red LED chip used in a light-emitting device according to Embodiment 1.

First, properties of the blue LED chip and the red LED chip used in light-emitting device 1 are described with reference to FIG. 2A to FIG. 2C. FIG. 2A to FIG. 2C illustrate an example of properties of the blue LED chip (first light-emitting element 11) and the red LED chip (second light-emitting element 12) used in the light-emitting device according to Embodiment 1. FIG. 2A, FIG. 2B, and FIG. 2C illustrate IF-VF properties, the relationship between temperature and VF ($\Delta VF/C.°$), and the relationship between temperature and light output ($\Delta$light output/C.°), respectively. Note that FIG. 2A to FIG. 2C illustrate properties per LED chip.

As illustrated in FIG. 2A, for each of the blue LED chip (first light-emitting element 11) and the red LED chip (second light-emitting element 12), the forward voltage (VF) increases as the forward current (IF) increases. Note that the red LED chip and the blue LED chip are different in the rate of changes in the forward voltage with respect to changes in the forward current. Specifically, the rate of increase in the forward voltage with respect to increase in the forward current is higher in the blue LED chip than in the red LED chip.

Furthermore, as illustrated in FIG. 2B, for each of the blue LED chip (first light-emitting element 11) and the red LED chip (second light-emitting element 12), the forward voltage (VF) decreases as the temperature (the junction temperature) increases. Note that the blue LED chip and the red LED chip are different in the rate of decrease in the forward voltage along with a temperature increase, and the rate of decrease in the forward voltage with respect to temperature variations is higher in the red LED chip than in the blue LED chip.

Furthermore, as illustrated in FIG. 2C, for each of the blue LED chip (first light-emitting element 11) and the red LED chip (second light-emitting element 12), the light output decreases as the temperature (the junction temperature) increases. Note that the blue LED chip and the red LED chip are different in the rate of decrease in the light output along with a temperature increase, and the rate of decrease in the light output with respect to a temperature increase is higher in the red LED chip than in the blue LED chip.

As illustrated in FIG. 2A to FIG. 2C, the blue LED chip and the red LED chip have different properties. One of the causes for this is considered to be a difference in semiconductor material between the respective chips. For example, the red LED chip is formed using a gallium arsenide (GaAs)-series semiconductor material, and the blue LED chip is formed using a gallium nitride-series semiconductor material.

Figure 3:
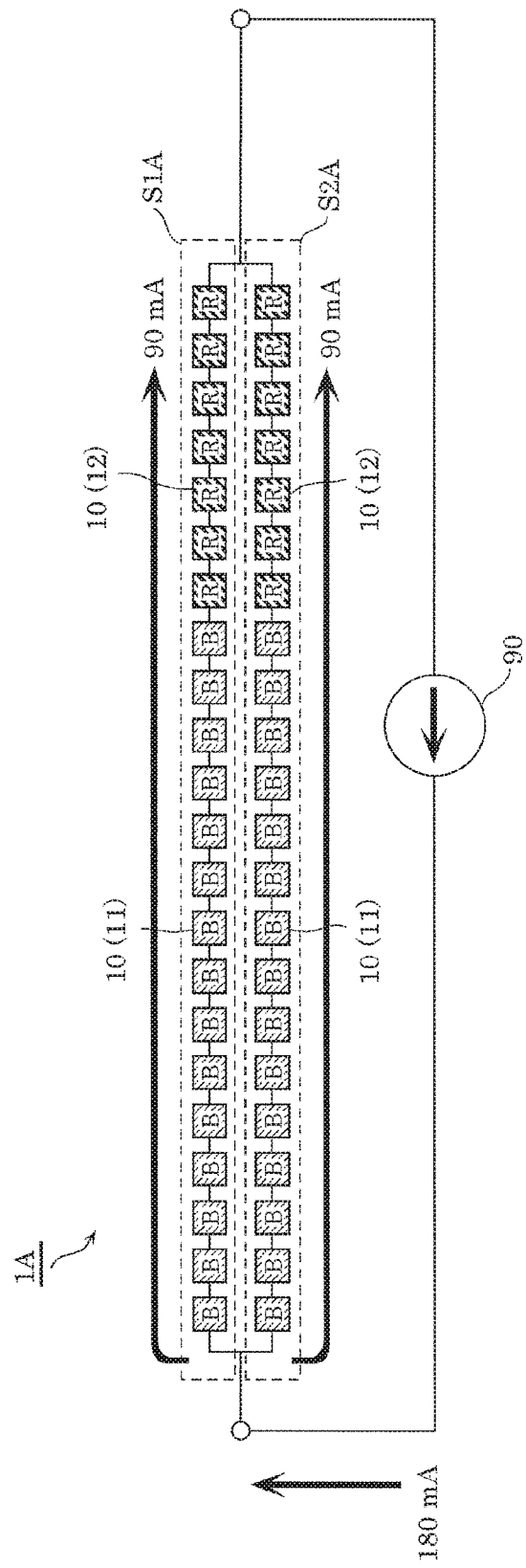
FIG. 3 illustrates an operation performed by a light-emitting device according to a comparative example.

Next, an operation of light-emitting device 1 according to the present embodiment which uses the blue LED chip and the red LED chip having such properties is described by comparison with light-emitting device 1A according to a comparative example. FIG. 3 illustrates an operation performed by a light-emitting device according to a comparative example. FIG. 4 illustrates an operation performed by a light-emitting device according to Embodiment 1.

As illustrated in FIG. 3, in light-emitting device 1A according to the comparative example, a ratio between a total number of first light-emitting elements 11 and a total number of second light-emitting elements 12 is the same in both first serial element group S1A and second serial element group S2A connected in parallel with each other. Specifically, in both first serial element group S1A and second serial element group S2A, the ratio between the total number of first light-emitting elements 11 and the total number of second light-emitting elements 12 is 15 to 7.

In this case, when power supply 90 (a constant current source in FIG. 3) powers on light-emitting device 1A and, for example, passes a current of 180 mA therethrough, a current of 90 mA flows through each of first serial element group S1A and second serial element group S2A.

However, when an ambient temperature (Ta) around light-emitting device 1A changes, the light output of each of the blue LED chip (first light-emitting element 11) and the red LED chip (second light-emitting element 12) changes according to the above-stated temperature-light output properties illustrated in FIG. 2C. Table 1 below shows changes in total light output of all the blue LED chips and in total light output of all the red LED chips in entire light-emitting device 1A.

TABLE 1

| Ta [° C.] | IF [mA] | VF [V] | Blue Light output [a.u.] | Red Light output [a.u.] |
| --- | --- | --- | --- | --- |
| 15 | 90/90 | 59.0 | 102 | 105 |
| 25 | 90/90 | 58.6 | 100 | 100 |
| 35 | 90/90 | 58.2 | 98 | 95 |
| 45 | 90/90 | 57.8 | 95 | 89 |
| 55 | 90/90 | 57.3 | 93 | 82 |
| 65 | 90/90 | 56.9 | 90 | 76 |

In Table 1, the light output of the blue LED chip represents a total light output of all the 30 chips, and the light output of the red LED chip represents a total light output of all the 14 chips. Each light output indicates a relative value, with 100 being the light output where the ambient temperature (Ta) is 25° C. In forward current (IF), a value on the left side indicates a value of current flowing through first serial element group S1A, and a value on the right side indicates a value of current flowing through second serial element group S2A. Forward voltage (VF) indicates a total voltage (total VF) of the parallel connection (the parallel circuit).

As shown in Table 1, the total light output of all the blue LED chips decreases and the total light output of all the red LED chips decreases as the ambient temperature (Ta) increases.

As described above, in light-emitting device 1A according to the comparative example, a constant current (of 90 mA) flows through each of the element groups connected in parallel regardless of temperature variations, but the total light output of all the blue LED chips and the total light output of all the red LED chips decrease as the temperature increases.

At this time, the temperature-light output properties are different between the blue LED chip and the red LED chip as illustrated in FIG. 2C. Specifically, the rate of decrease in the light output along with a temperature increase is higher in the red LED chip than in the blue LED chip.

As a result, since the ratio between the total number of blue LED chips (first light-emitting elements 11) and the total number of red LED chips (second light-emitting elements 12) is the same in first serial element group S1A and in second serial element group S2A, a difference between the total light output of all the blue LED chips and the total light output of all the red LED chips (a difference in light output) increases gradually as the temperature increases (as time passes after the start of lighting) as shown in Table 1. This leads to a change in color of light which light-emitting device 1A emits. This change is recognized as a difference in chromaticity.

In contrast, in light-emitting device 1 according to the present embodiment, the ratio between the total number of first light-emitting elements 11 and the total number of second light-emitting elements 12 is different between first serial element group S1 and second serial element group S2 connected in parallel, as illustrated in FIG. 4. Specifically, the ratio between first light-emitting elements 11 and second light-emitting elements 12 is 20:0 in first serial element group S1 and 10:15 in second serial element group S2.

In this case, when power supply 90 powers on light-emitting device 1 and, for example, passes a current of 180 mA therethrough, a current of 90 mA flows through each of first serial element group S1 and second serial element group S2 in the case where the ambient temperature is 25° C.

Furthermore, also in light-emitting device 1 according to the present embodiment as in light-emitting device 1A according to the comparative example, the light output of each of the blue LED chip and the red LED chip changes as an ambient temperature (Ta) around light-emitting device 1 changes. Specifically, as represented in FIG. 2C, the light output of each of the blue LED chip and the red LED chip decreases as the temperature increases.

However, in light-emitting device 1 according to the present embodiment, the ratio between the total number of first light-emitting elements 11 and the total number of second light-emitting elements 12 is different between first serial element group S1 and second serial element group S2, unlike in light-emitting device 1A according to the comparative example.

With this, due to a difference in the temperature-VF properties (ΔVF/C.° properties) between the blue LED chip and the red LED chip represented in FIG. 2B, second serial element group S2 in which the ratio of the total number of red LED chips (second light-emitting elements 12) is high passes current therethrough better when the temperature increases. Specifically, current flowing through first serial element group S1 and second serial element group S2 changes as indicated in Table 2 below. The values of current in FIG. 4 are values of current (IF) that flows when the ambient temperature (Ta) is 55° C.

TABLE 2

| Ta [° C.] | IF [mA] | VF [V] | Blue Light output [a.u.] | Red Light output [a.u.] |
|---|---|---|---|---|
| 15 | 91.3/88.7 | 59.6 | 103 | 103 |
| 25 | 90/90 | 59.1 | 100 | 100 |
| 35 | 88.5/91.5 | 58.6 | 97 | 96 |
| 45 | 87/93 | 58.2 | 94 | 92 |
| 55 | 85.5/94.5 | 57.7 | 91 | 86 |
| 65 | 84/96 | 56.9 | 88 | 81 |

Thus, since second serial element group S2 in which the ratio of the total number of red LED chips (second light-emitting elements 12) is high passes current therethrough better when the temperature increases, a decrease in light output, due to an increase in temperature, of the red LED chips in which the rate of decrease in light output is high can be covered by the increase in current. In other words, current that flows through each of the element groups (first serial element group S1 and second serial element group S2) connected in parallel with respect to temperature variations is adjusted using the ratio between the total number of blue LED chips and the total number of red LED chips in each of the element groups (first serial element group S1 and second serial element group S2).

Accordingly, even when the ambient temperature (Ta) increases and both the total light output of all the blue LED chips and the total light output of all the red LED chips decrease, the total light output of all the blue LED chips and the total light output of all the red LED chips decrease at the same or similar rates without much difference therebetween as shown in Table 2.

Stated differently, current that flows through each of the element groups connected in parallel is adjusted to absorb a difference in the temperature-light output properties (Δlight output/° C.) between respective blue and red LED chips so that the total light output of all the blue LED chips and the total light output of all the red LED chips decrease at rates that remain the same or similar.

Therefore, although the luminous flux of light which light-emitting device 1 emits is reduced as the temperature increases (as time passes after the start of lighting), it is possible to reduce changes in color of the light and therefore reduce the difference in chromaticity.

In Table 2, the light output of the blue LED chip represents a total light output of all the 30 chips, and the light output of the red LED chip represents a total light output of all the 15 chips. Each light output indicates a relative value, with 100 being the light output where the ambient temperature (Ta) is 25° C. In forward current (IF), a value on the left side indicates a value of current flowing through first serial element group S1, and a value on the right side indicates a value of current flowing through second serial element group S2. Forward voltage (VF) indicates a total voltage (total VF) of the parallel connection (the parallel circuit).

In the present embodiment, a total forward voltage in first serial element group S1 and a total forward voltage in second serial element group S2 are equal. Specifically, the total number of light-emitting elements 10 (first light-emitting elements 11 and second light-emitting elements 12) in first serial element group S1 and second serial element group S2 is adjusted so that the respective forward voltages in first serial element group S1 and second serial element group S2 (in the element groups connected in parallel) are the same.

Although light-emitting device 1 is connected to a single power system in the present embodiment, that is, a constant current source is connected as power supply 90 to light-emitting device 1 as illustrated in FIG. 3, power supply 90 is not limited to a constant current source.

[Specific Example of Light-Emitting Device]

Figure 5B:
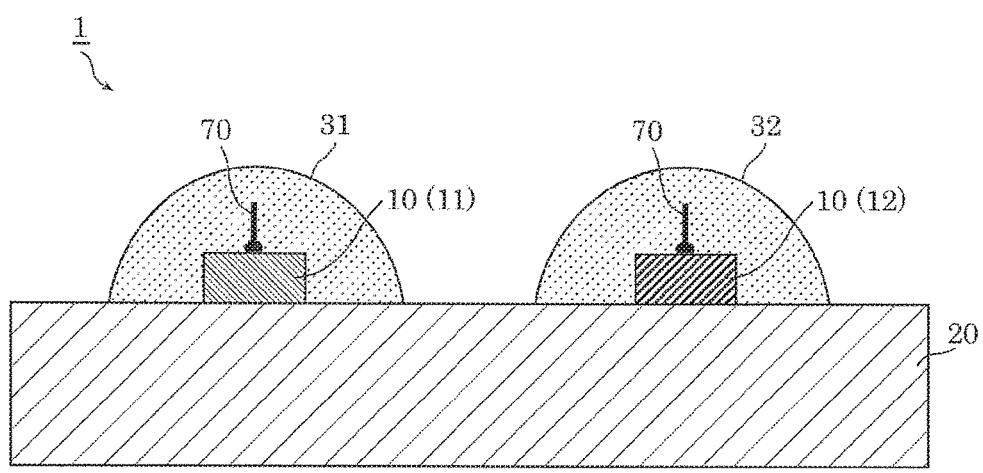
FIG. 5B is a cross-sectional view of a light-emitting device according to Embodiment 1, taken along line VB-VB of FIG. 5A.

Next, a specific structure of light-emitting device 1 according to Embodiment 1 is described with reference to FIG. 5A and FIG. 5B. FIG. 5A is a plan view illustrating a specific example of a light-emitting device according to Embodiment 1. FIG. 5B is a cross-sectional view of the light-emitting device taken along line VB-VB of FIG. 5A.

As illustrated in FIG. 5A, light-emitting device 1 includes substrate 20 and plural light-emitting elements 10 disposed above substrate 20. Light-emitting device 1 includes, as plural light-emitting elements 10, first light-emitting element 11 (a blue LED chip) and second light-emitting element 12 (a red LED chip).

Light-emitting device 1 further includes: first sealing member 31 which seals first light-emitting element 21; second sealing member 32 which seals second light-emitting element 22; wiring 40; paired power feeding terminals 50; and wire 60.

Light-emitting device 1 according to the present embodiment is a COB (chip-on-board) LED module in which an LED chip is directly mounted on substrate 20. Light-emitting device 1 is a white LED light source of B—Y type which emits white light using a blue LED chip (first light-emitting element 11) and a yellow phosphor, with a red LED chip (second light-emitting element 12) added thereto in order to enhance the color rendering properties.

Each structural member of light-emitting device 1 is described below in more detail.

[Light-Emitting Element]

Plural light-emitting elements 10 include first serial element group S1 and second serial element group S2 connected in parallel. Like in FIG. 1, 20 first light-emitting elements 11 are connected in series in first serial element group S1, and 10 first light-emitting elements 11 and 15 second light-emitting elements 12 are connected in series in second serial element group S2.

Note that in FIG. 5A, first light-emitting elements 11 and second light-emitting elements 12 are electrically connected in a periodic arrangement in second serial element group S2. First light-emitting elements 11 and second light-emitting elements 12 are mounted in a periodic arrangement in plan view. Specifically, five light-emitting elements 10 consisting of the blue LED chips (first light-emitting elements 11) and the red LED chips (second light-emitting elements 12) arranged in the following order: "red," "blue," "red," "blue," and "red," are grouped as one unit, which is provided repeatedly, herein, five times.

First light-emitting element 11 and second light-emitting element 12 are mounted above a first principal surface of substrate 20. Chips used as 30 first light-emitting elements 11 above substrate 20 are the same. In other words, all the properties of 30 first light-emitting elements 11 (IF-VF properties, temperature-VF properties, temperature-light output properties, etc.) are the same. Likewise, chips used as 15 second light-emitting elements 12 are also the same.

First light-emitting element 11 is a blue LED chip that emits blue light when energized, and has a peak wavelength, for example, in the range from 400 nm to 500 nm. The blue LED chip is formed from a gallium nitride (GaN) semiconductor material, for example.

Second light-emitting element 12 is, as mentioned above, a red LED chip that emits red light when energized, and has a peak wavelength, for example, in the range from 570 nm to 680 nm. The red LED chip is formed from a gallium arsenide (GaAs) semiconductor material, for example.

Both first light-emitting element 11 and second light-emitting element 12 have a single-sided electrode structure in which both a p-electrode and an n-electrode are formed on the top surface of a semiconductor layer. Therefore, in each of first serial element group S1 and second serial element group S2, light-emitting element 10 (first light-emitting element 11 and second light-emitting element 12) is connected chip to chip, and adjacent light-emitting elements 10 are connected to each other with wire 60 continuously wire-bonding two electrodes (the p-electrode and the n-electrode) on the top surfaces of light-emitting elements 10 sequentially. Wire 60 is a gold wire, for example.

Note that first light-emitting element 11 and second light-emitting element 12 are not limited to the single-sided electrode structure and may have a structure in which the p-electrode (the front electrode) is formed on the top surface of a semiconductor layer formed on a conductive substrate and the n-electrode (the back electrode) is formed on the back surface of the conductive substrate (a double-sided electrode structure). Furthermore, the way to interconnect adjacent light-emitting elements 10 is not limited to chip-to-chip and may be wire-bonding using lands.

[Substrate]

Substrate 20 is a mounting substrate for mounting light-emitting element 10 (first light-emitting element 11 and second light-emitting element 12) and is a plate-shaped substrate having a first principal surface (a front face) and a second principal surface (a back face) opposite to the first principal surface. The plan view shape of substrate 20 is, for example, a rectangle, but may be a circle or a polygon such as a hexagon.

A ceramic substrate such as an alumina substrate, a resin substrate such as a glass epoxy substrate (CEM-3, etc.), a metal-based substrate such as an aluminum alloy substrate the surface of which is coated with an electrically insulating film, or a glass substrate can be used as substrate 20. The ceramic substrate may be a highly reflective white ceramic substrate or a light-transmissive substrate having a high rate of transmittance. Note that substrate 20 is not limited to a rigid substrate and may be a flexible substrate.

[Sealing Member]

First sealing member 31 coats light-emitting element 10 included in first serial element group S1. Second sealing member 32 coats light-emitting element 10 included in second serial element group S2.

In the present embodiment, so as to collectively seal all light-emitting elements 10 included in first serial element group S1, first sealing member 31 is linearly formed along the arrangement of light-emitting elements 10, as illustrated in FIG. 5A. Likewise, so as to collectively seal all light-emitting elements 10 included in second serial element group S2, second sealing member 32 is linearly formed along the arrangement of light-emitting elements 10. Note that first sealing member 31 and second sealing member 32 may be in the form of dots to individually coat each light-emitting element 10 or a few light-emitting elements 10.

First sealing member 31 and second sealing member 32 include: a wavelength converting material that is excited by light from first light-emitting element 11 and emits light of a wavelength different from the wavelength of light from first light-emitting element 11; and a light-transmissive material containing the wavelength converting material.

For example, a light-transmissive, electrically insulating resin material such as a silicone resin, an epoxy resin, or a fluorine-based resin may be used as the light-transmissive material included in first sealing member 31 and second sealing member 32. The light-transmissive material is not necessarily limited to an organic material such as a resin material and may be an inorganic material such as glass having a low melting point or sol-gel glass.

The wavelength converting material included in first sealing member 31 and second sealing member 32 are, for example, phosphor. The phosphor is contained in the light-transmissive material and is excited using, as excitation light, light emitted by first light-emitting element 11 and emits light (fluorescence), thereby radiating light of a desired color (wavelength).

In the present embodiment, since first light-emitting element 11 is a blue LED chip, a yttrium aluminum garnet (YAG) yellow phosphor can, for example, be used as the phosphor in order to obtain white light. With this, a portion of the blue light emitted by the blue LED chip is absorbed by the yellow phosphor and converted into yellow light through wavelength conversion. In other words, the yellow phosphor is excited by the blue light from the blue LED chip and emits yellow light. This yellow light from the yellow phosphor and the blue light not absorbed by the yellow phosphor are mixed to generate white light as synthetic light. First sealing member 31 and second sealing member 32 emit this white light.

Note that the yellow phosphor is not excited by the red light from second light-emitting element 22 (the red LED chip). In order to enhance light-diffusing properties, a light diffusing material, such as silica, may be dispersed in first sealing member 31 and second sealing member 32.

In the present embodiment, first sealing member 31 and second sealing member 32 are a phosphor-containing resin in which a yellow phosphor is dispersed in a silicone resin. In this case, first sealing member 31 and second sealing member 32 can be applied to substrate 20 by a dispenser and cured into a predetermined shape. First sealing member 31 and second sealing member 32 formed as described above are in the form of a semicylinder. The cross-section of first sealing member 31 and second sealing member 32 orthogonal to a longitudinal direction thereof is in the shape of a substantial semicircle as illustrated in FIG. 5B

[Wiring]

Wiring 40 is a power feeding line for supplying first light-emitting element 11 and second light-emitting element 12 with electric power for causing first light-emitting element 11 and second light-emitting element 12 to emit light. Wiring 40 is a wiring pattern formed in a predetermined shape on the first principal surface of substrate 20. As illustrated in FIG. 5A, wiring 40 extends from power feeding terminal 50.

Wiring 40 is, for example, metal wiring made from a metal material such as Au, Ag, or Cu, and can, for example, be formed by printing or the like. Alternatively, wiring 40 may be formed by etching a substrate coated with a metal film such as a copper film.

[Power Feeding Terminal]

Paired power feeding terminals 50 are each an external connection terminal for receiving predetermined power from outside light-emitting device 1 (an external power supply) or the like, and are each a metal electrode (a metal terminal) of Au or the like formed by patterning into the shape of a rectangle on the first principal surface of substrate 20, for example.

One of paired power feeding terminals 50 is a high voltage side (plus side) connection terminal. The other of paired power feeding terminals 50 is a low voltage side (minus side) connection terminal. In the present embodiment, paired power feeding terminals 50 receive direct-current (DC) power for causing first light-emitting element 11 and second light-emitting element 12 to emit light. The DC power received by paired power feeding terminals 50 is supplied to each light-emitting element 10 via wiring 40 and wire 60.

For example, as illustrated in FIG. 3, light-emitting device 1 is connected to power supply 90 (a constant power supply) serving as an external power supply, to receive DC power supplied thereto. In this case, power supply 90 and paired power feeding terminals 50 are electrically connected to each other with a connector wire or the like.

Note that power feeding terminal 50 may be a socket receptacle. In this case, power feeding terminal 50 includes a resin socket and a conductive part (a conductive pin) for receiving DC power. The conductive part is electrically connected to wiring 40 formed on substrate 20.

[Conclusion]

According to light-emitting device 1 in the present embodiment described above, a ratio between the total number of first light-emitting elements 11 and the total number of second light-emitting elements 12 which are different in the rate of decrease in the light output along with a temperature increase is different between first serial element group S1 and second serial element group S2 connected in parallel.

With this, as compared to the case where the ratio between the total number of first light-emitting elements 11 and the total number of second light-emitting elements 12 is the same in first serial element group S1 and second serial element group S2, the increase in the difference between the total light output of all first light-emitting elements 11 and the total light output of all second light-emitting elements 12 along with a temperature increase can be reduced. This means that the total light output of all first light-emitting elements 11 and the total light output of all second light-emitting elements 12 are not likely to be off-balanced. Thus, the difference in chromaticity due to temperature variations can be reduced.

Furthermore, in the present embodiment, the total forward voltage in first serial element group S1 and a total forward voltage in second serial element group S2 are equal.

With this, it is possible to pass the same forward current through first serial element group S1 and second serial element group S2 when there is no variation in temperature.

Furthermore, in the present embodiment, first light-emitting element 11 is a blue LED chip, and second light-emitting element 12 is a red LED chip.

With this, when the blue LED chip and the yellow phosphor generate white light, the red LED chip can supplement the white light with a red component, allowing improvement of the color rendering properties. Thus, it is possible both to reduce the difference in chromaticity and to improve the color rendering properties.

Furthermore, in the present embodiment, first light-emitting elements 11 and second light-emitting elements 12 are mounted in a periodic arrangement in plan view.

With this, since first light-emitting elements 11 and second light-emitting elements 12 can be dispersedly arranged, chromatic unevenness can be inhibited.

In this case, no more than two second light-emitting elements 12 (red LED chips) may be consecutive. Three or more consecutive second light-emitting elements 12 would easily cause chromatic unevenness. Especially, in a light-emitting device of B—Y type that generates white light by using a blue LED chip and a yellow phosphor, three or more consecutive red LED chips would easily lead to chromatic unevenness. Therefore, when second light-emitting elements 12 are dispersedly arranged so that no more than two second light-emitting elements 12 are consecutive, chromatic unevenness can be further inhibited.

Note that although only first light-emitting elements 11 (the blue LED chips) are included in first serial element group S1 in the present embodiment, second light-emitting element 12 (the red LED chip) may also be included in first serial element group S1.

Embodiment 2

Figure 6:
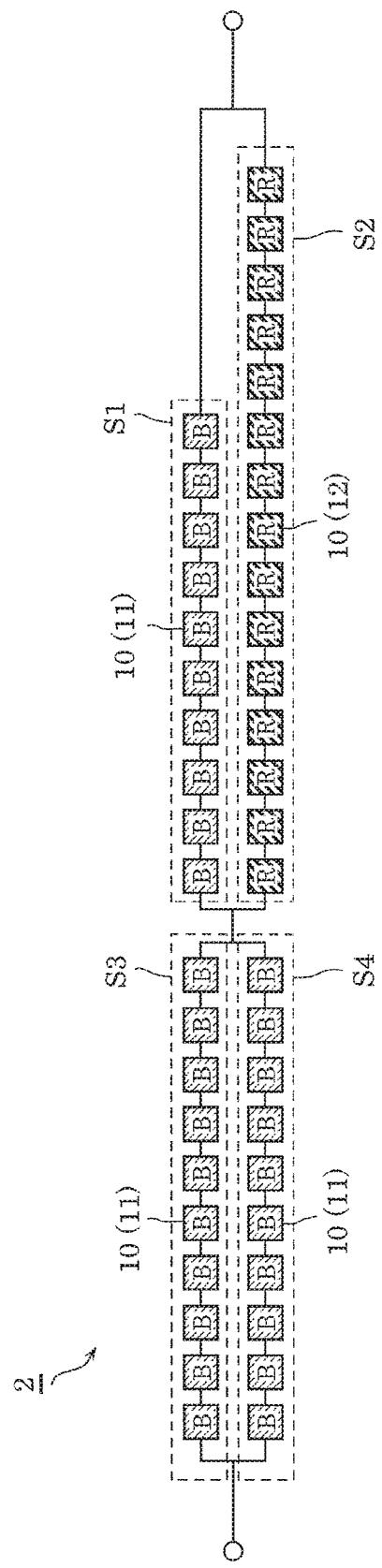
FIG. 6 illustrates a basic structure of a light-emitting device according to Embodiment 2.
Figure 7:
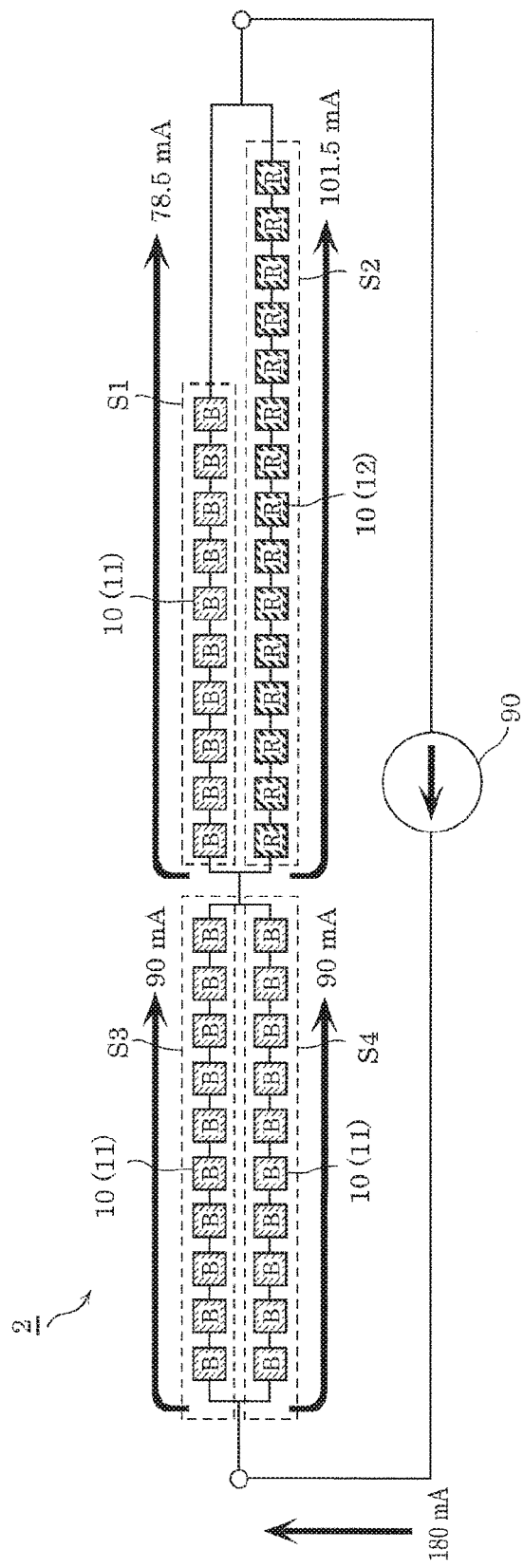
FIG. 7 illustrates an operation performed by a light-emitting device according to Embodiment 2.

Next, light-emitting device 2 according to Embodiment 2 is described with reference to FIG. 6 and FIG. 7. FIG. 6 illustrates a basic structure of a light-emitting device according to Embodiment 2. FIG. 7 illustrates an operation performed by the light-emitting device.

Although light-emitting elements 10 are connected to form one parallel circuit (first serial element group S1 and second serial element group S2) in light-emitting device 1 according to Embodiment 1, light-emitting elements 10 may be connected to form a plurality of parallel circuits in light-emitting device 2 according to the present embodiment.

Specifically, as illustrated in FIG. 6 and FIG. 7, light-emitting elements 10 in light-emitting device 2 include first serial element group S1 and second serial element group S2 connected in parallel and third serial element group S3 and fourth serial element group S4 connected in parallel.

Also in the present embodiment, 30 first light-emitting elements (blue LED chips) and 15 second light-emitting elements (red LED chips) are used; 45 light-emitting elements 10 are used in total.

In first serial element group S1, 10 first light-emitting elements 11 are connected in series. In other words, first light-emitting elements 11 and second light-emitting elements 12 are included at a ratio of 10 to zero in first serial element group S1.

In second serial element group S2, 15 second light-emitting elements 12 are connected in series. In other words, first light-emitting elements 11 and second light-emitting elements 12 are included at a ratio of zero to 15 in second serial element group S2.

In each of third serial element group S3 and fourth serial element group S4, 10 first light-emitting elements 11 are connected in series. In other words, first light-emitting elements 11 and second light-emitting elements 12 are included at a ratio of 10 to zero in each of third serial element group S3 and fourth serial element group S4.

In light-emitting device 2 thus structured, a ratio between a total number of first light-emitting elements 11 and a total number of second light-emitting elements 12 is different between first serial element group S1 and second serial element group S2 connected in parallel, as in the case of Embodiment 1.

Next, an operation of light-emitting device 2 according to the present embodiment is described. Also in the present embodiment, a blue LED chip (first light-emitting element 11) and a red LED chip (second light-emitting element 12) having properties represented in FIG. 2A to FIG. 2C are used.

In light-emitting device 2 according to the present embodiment, as illustrated in FIG. 7, a ratio between the total number of first light-emitting elements 11 and the total number of second light-emitting elements 12 is different between first serial element group S1 and second serial element group S2 connected in parallel. Specifically, the ratio between first light-emitting elements 11 and second light-emitting elements 12 is 10 to zero in first serial element group S1 and zero to 15 in second serial element group S2.

In this case, when power supply 90 powers on light-emitting device 2 and, for example, passes a current of 180 mA therethrough, a current of 90 mA flows through first serial element group S1, second serial element group S2, third serial element group S3, and fourth serial element group S4 in the case where the ambient temperature is 25° C.

Also in light-emitting device 2 according to the present embodiment, as an ambient temperature (Ta) around light-emitting device 2 changes, current flowing through first serial element group S1 and second serial element group S2 changes as indicated in Table 3 below. In short, second serial element group S2 in which the ratio of the total number of red LED chips (second light-emitting elements 12) is high passes current therethrough better when the temperature increases. The values of current in FIG. 7 are values of current (IF) that flows when the ambient temperature (Ta) is 55° C.

TABLE 3

| Ta [° C.] | IF [mA]<br>Parallel circuit 1:<br>blue LED plus red LED<br>Parallel circuit 2:<br>only blue LED | | VF [V]<br>Parallel circuit 1:<br>blue LED plus red LED<br>Parallel circuit 2:<br>only blue LED | | Blue Light output [a.u.] | Red Light output [a.u.] |
|---|---|---|---|---|---|---|
| 15 | Parallel circuit 1 | 93.4/86.6 | Parallel circuit 1 | 29.4 | 104 | 101 |
|  | Parallel circuit 2 | 90/90 | Parallel circuit 2 | 30.2 |  |  |
| 25 | Parallel circuit 1 | 90/90 | Parallel circuit 1 | 29.1 | 100 | 100 |
|  | Parallel circuit 2 | 90/90 | Parallel circuit 2 | 30.0 |  |  |
| 35 | Parallel circuit 1 | 86.1/93.9 | Parallel circuit 1 | 28.7 | 96 | 99 |
|  | Parallel circuit 2 | 90/90 | Parallel circuit 2 | 29.9 |  |  |
| 45 | Parallel circuit 1 | 82.2/97.8 | Parallel circuit 1 | 28.4 | 92 | 96 |
|  | Parallel circuit 2 | 90/90 | Parallel circuit 2 | 59.9 |  |  |
| 55 | Parallel circuit 1 | 78.5/101.5 | Parallel circuit 1 | 28.0 | 89 | 93 |
|  | Parallel circuit 2 | 90/90 | Parallel circuit 2 | 29.5 |  |  |
| 65 | Parallel circuit 1 | 74.7/105.3 | Parallel circuit 1 | 27.7 | 85 | 88 |
|  | Parallel circuit 2 | 90/90 | Parallel circuit 2 | 29.4 |  |  |

As indicated in Table 3, even when the ambient temperature (Ta) increases and both the total light output of all the blue LED chips and the total light output of all the red LED chips decrease, the total light output of all the blue LED chips and the total light output of all the red LED chips decrease at the same or similar rates without much difference therebetween.

Therefore, although the luminous flux of light which light-emitting device 2 emits is reduced as the temperature increases, it is possible to reduce changes in color of the light and therefore reduce the difference in chromaticity.

In Table 3, the light output of the blue LED chip represents a total light output of all the 30 chips, and the light output of the red LED chip represents a total light output of all the 15 chips. Each light output indicates a relative value, with 100 being the light output where the ambient temperature (Ta) is 25° C. Values indicated in forward current (IF) and forward voltage (VF) are those of parallel circuit 1 (first serial element group S1 and second serial element group S2) and those of parallel circuit 2 (third serial element group S3 and fourth serial element group S4). In this case, in forward current (IF), a value on the left side indicates a value of current flowing through first serial element group S1 or third serial element group S3, and a value on the right side indicates a value of current flowing through second serial element group S2 or fourth serial element group S4. Forward voltage (VF) indicates a total voltage (total VF) of each parallel connection (each parallel circuit).

Also in the present embodiment, a total forward voltage in first serial element group S1 and a total forward voltage in second serial element group S2 are equal.

According to light-emitting device 2 in the present embodiment described above as well, a ratio between the total number of first light-emitting elements 11 and the total number of second light-emitting elements 12 which are different in the rate of decrease in the light output along with a temperature increase is different between first serial element group S1 and second serial element group S2 connected in parallel, as in the case of Embodiment 1.

With this, as in the case of Embodiment 1, the increase in the difference between the total light output of all first light-emitting elements 11 and the total light output of all second light-emitting elements 12 along with a temperature increase can be reduced, so that the difference in chromaticity due to temperature variations can be reduced.

Also in the present embodiment, a COB light-emitting device such as that illustrated in FIG. 5A and FIG. 5B can be provided.

Furthermore, although only first light-emitting elements 11 (the blue LED chips) are included in first serial element group S1 in the present embodiment, second light-emitting element 12 (the red LED chip) may also be included in first serial element group S1. Likewise, although only second light-emitting elements 12 (the red LED chips) are included in second serial element group S2 in the present embodiment, first light-emitting element 11 (the blue LED chip) may also be included in second serial element group S2.

Embodiment 3

Figure 8:
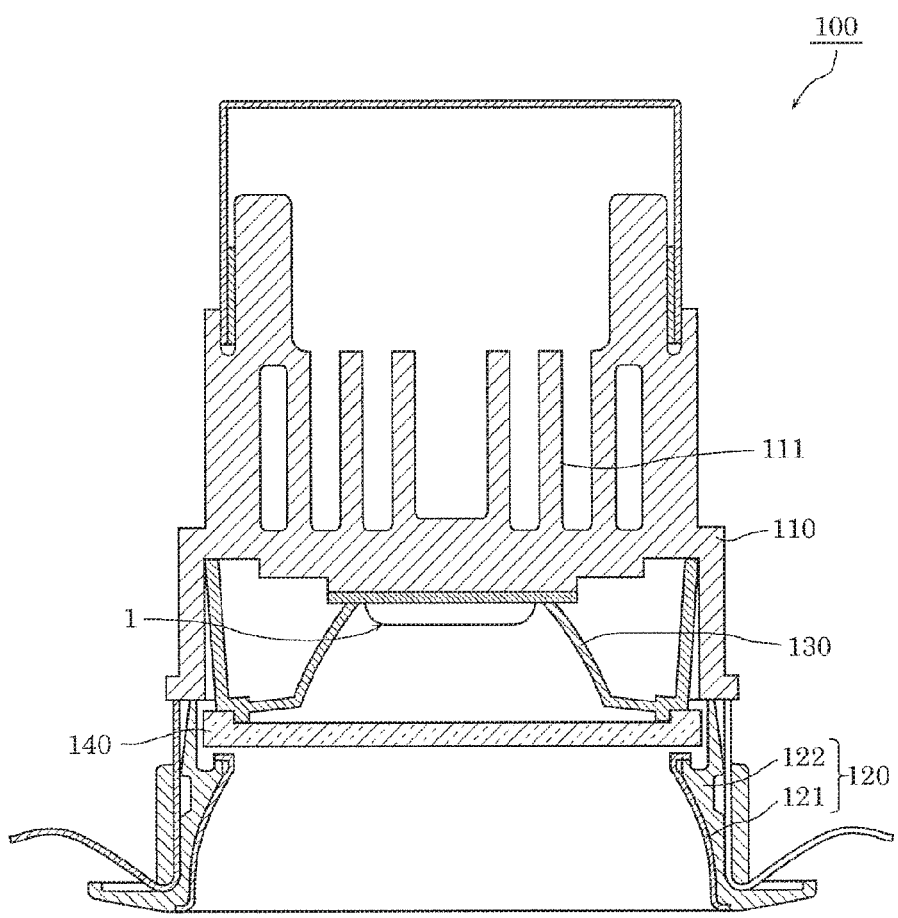
FIG. 8 is a cross-sectional view of an illumination apparatus according to Embodiment 3.
Figure 9:
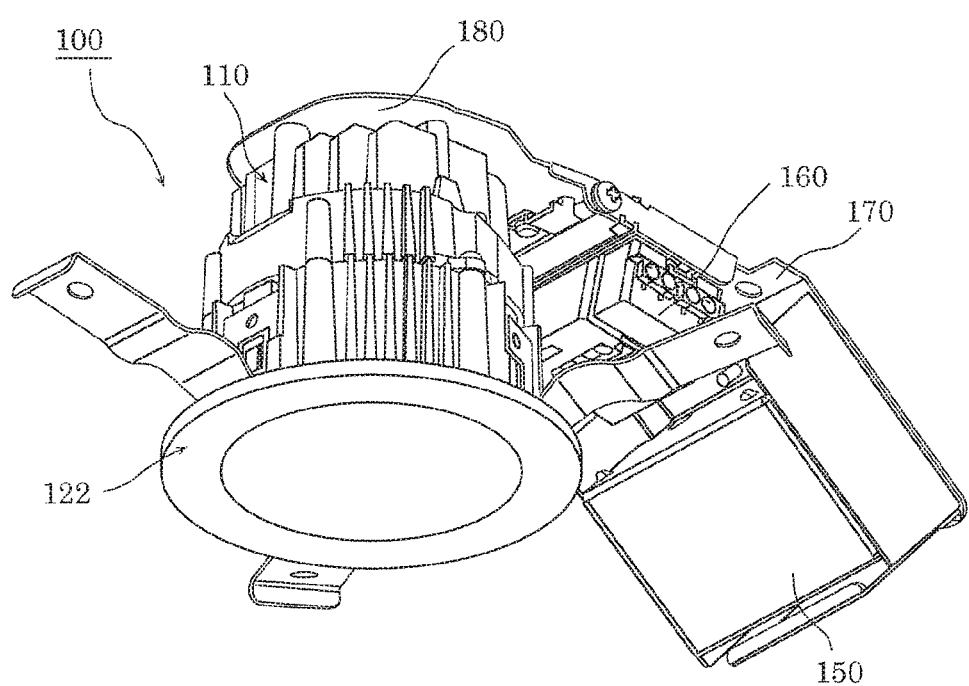
FIG. 9 is a perspective view of an external appearance of an illumination apparatus according to Embodiment 3.

Next, illumination apparatus 100 according to Embodiment 3 is described with reference to FIG. 8 and FIG. 9. FIG. 8 is a cross-sectional view of an illumination apparatus according to Embodiment 3. FIG. 9 is a perspective view of an external appearance of an illumination apparatus according to Embodiment 3.

As illustrated in FIG. 8 and FIG. 9, illumination apparatus 100 according to the present embodiment is an example of a lighting fixture including a light-emitting device, and is a sunken lighting fixture, such as a recessed light, that emits light downward (toward the floor or a wall, for example) by being installed, for example, in the ceiling of a house. Illumination apparatus 100 includes light-emitting device 1 which is an LED light source, an apparatus body in the shape of a substantial bottomed tube formed by joining pedestal 110 and frame 120, and reflection plate 130 and light-transmissive panel 140 disposed on this apparatus body.

Pedestal 110 is an attachment base to which light-emitting device 1 is attached, and also serves as a heat sink for dissipating heat generated by light-emitting device 1. Pedestal 110 is formed into a substantially columnar shape using a metal material and is, in the present embodiment, made from die-cast aluminum.

Plural heat-dissipating fins 111 are provided at predetermined intervals along one direction on the top portion (ceiling-side portion) of pedestal 110 so as to protrude upward. With this, heat generated by light-emitting device 1 can be efficiently dissipated.

Frame 120 includes: cone portion 121 including a reflective surface on an inner surface and having a substantially circular tube shape; and frame body 122 to which cone portion 121 is attached. Cone portion 121 is formed using a metal material and can, for example, be formed from an aluminum alloy or the like by metal spinning or pressing. Frame body 122 is formed from a hard resin material or a metal material. Frame 120 is fixed by frame body 122 being attached to pedestal 110.

Reflection plate 130 is an annular-frame-shaped (funnel-shaped) reflection member having an inner surface reflection function. For example, reflection plate 130 can be formed using a metal material such as aluminum. Note that reflection plate 130 may be formed using a hard white resin material instead of a metal material.

Light-transmissive panel 140 is a light-transmissive member having light-diffusing properties and light-transmitting properties. Light-transmissive panel 140 is a flat plate disposed between reflection plate 130 and frame 120, and is attached to reflection plate 130. For example, light-transmissive panel 140 can be formed into a disc shape using a transparent resin material such as acrylic or polycarbonate.

Note that light-transmissive panel 140 is not always required. Eliminating light-transmissive panel 140 from an illumination apparatus leads to improvement of a luminous flux of the illumination apparatus.

Furthermore, as illustrated in FIG. 9, illumination apparatus 100 includes lighting device 150 which supplies lighting power to light-emitting device 1, and terminal base 160 which relays AC power from a commercial power supply to lighting device 150.

Switching device 150 and terminal base 160 are attached to and thus fixed to attachment plate 170 provided separately from the apparatus body. Attachment plate 170 is formed by folding a rectangular plate member made of a metal material, and has one longitudinal end the bottom surface of which lighting device 150 is attached to and the other longitudinal end the bottom surface of which terminal base 160 is attached to. Attachment plate 170 is connected together with top plate 180 which is fixed to a top portion of pedestal 110 of the apparatus body.

As described above, light-emitting device 1 according to the preset embodiment can be used as a light source unit of illumination apparatus 100 such as a recessed light. With illumination apparatus 100 structured as described above, since it includes light-emitting device 1 according to Embodiment 1, it is possible both to reduce the difference in chromaticity and to improve the color rendering properties.

Especially, recessed lights and spotlights require good color rendering properties for illuminating particular products and merchandise in shops and the like. Therefore, a lighting fixture using light-emitting device 1 according to the present embodiment is suitable for such recessed lights and spotlights.

Although light-emitting device 1 according to Embodiment 1 is used in the present embodiment, light-emitting device 2 according to Embodiment 2 may be used.

Variation

Although the light-emitting device and the illumination apparatus according to the present disclosure have been described above based on the embodiments, the present disclosure is not limited to the above-described embodiments.

For example, first serial element group S1 and second serial element group S2 include light-emitting elements 10 arranged in two parallel straight lines, as illustrated in FIG. 5A, in Embodiment 1 described above, but this is not the only example.

Figure 10:
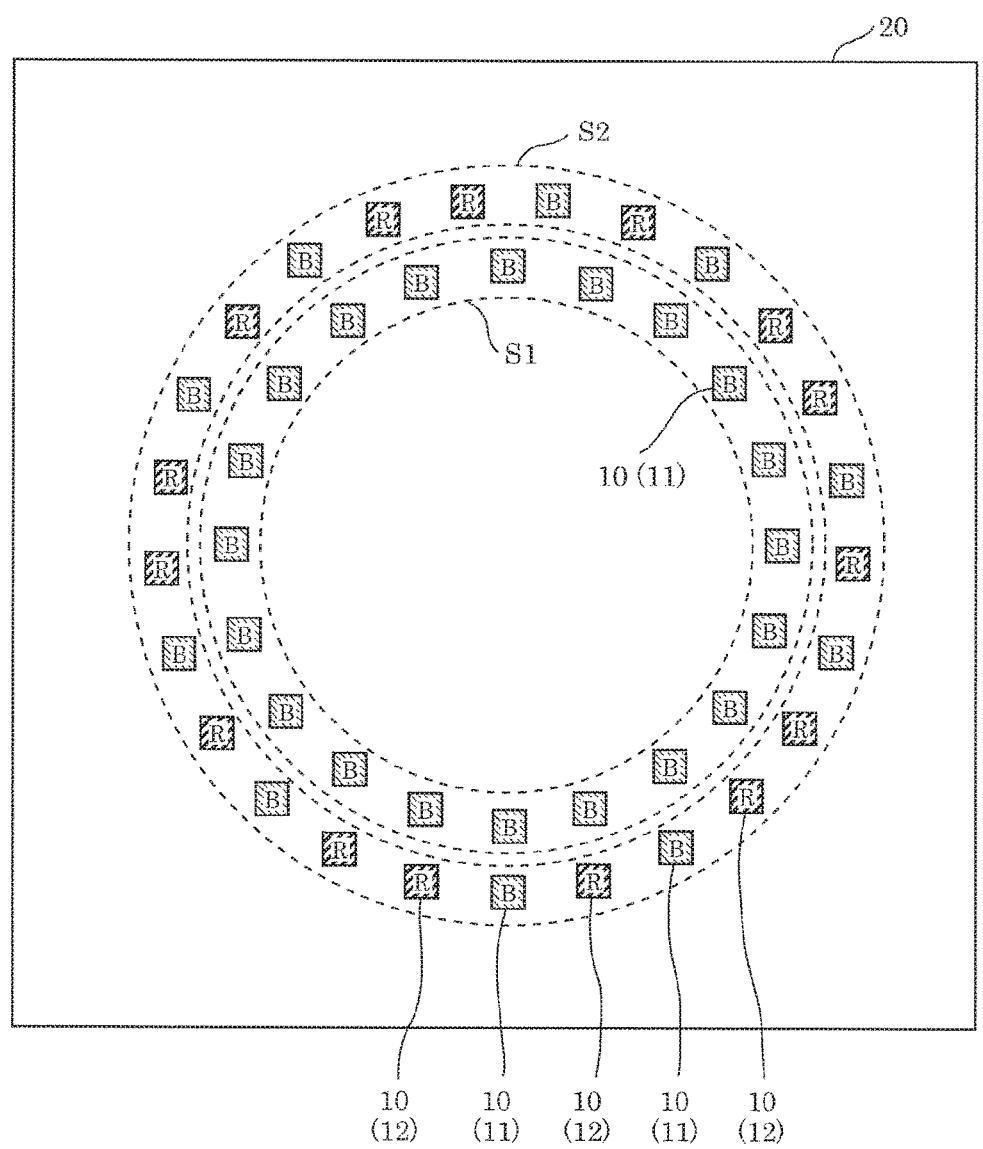
FIG. 10 is a plan view schematically illustrating a light-emitting device according to Variation 1.

Specifically, as illustrated in FIG. 10, first serial element group S1 and second serial element group S2 may include light-emitting elements 10 arranged in a double circle. In this case, first serial element group S1 in which the total number of light-emitting elements 10 is smaller is disposed inside and second serial element group S2 in which the total number of light-emitting elements 10 is greater is disposed outside so that light-emitting elements 10 can be easily evenly dispersed.

In FIG. 10, as in the case of Embodiment 1, five light-emitting elements 10 consisting of the blue LED chips (first light-emitting elements 11) and the red LED chips (second light-emitting elements 12) arranged in the following order: "red," "blue," "red," "blue," and "red," are grouped as one unit, and this unit is provided repeatedly, herein, five times, in second serial element group S2, but this is not only the example.

Figure 11:
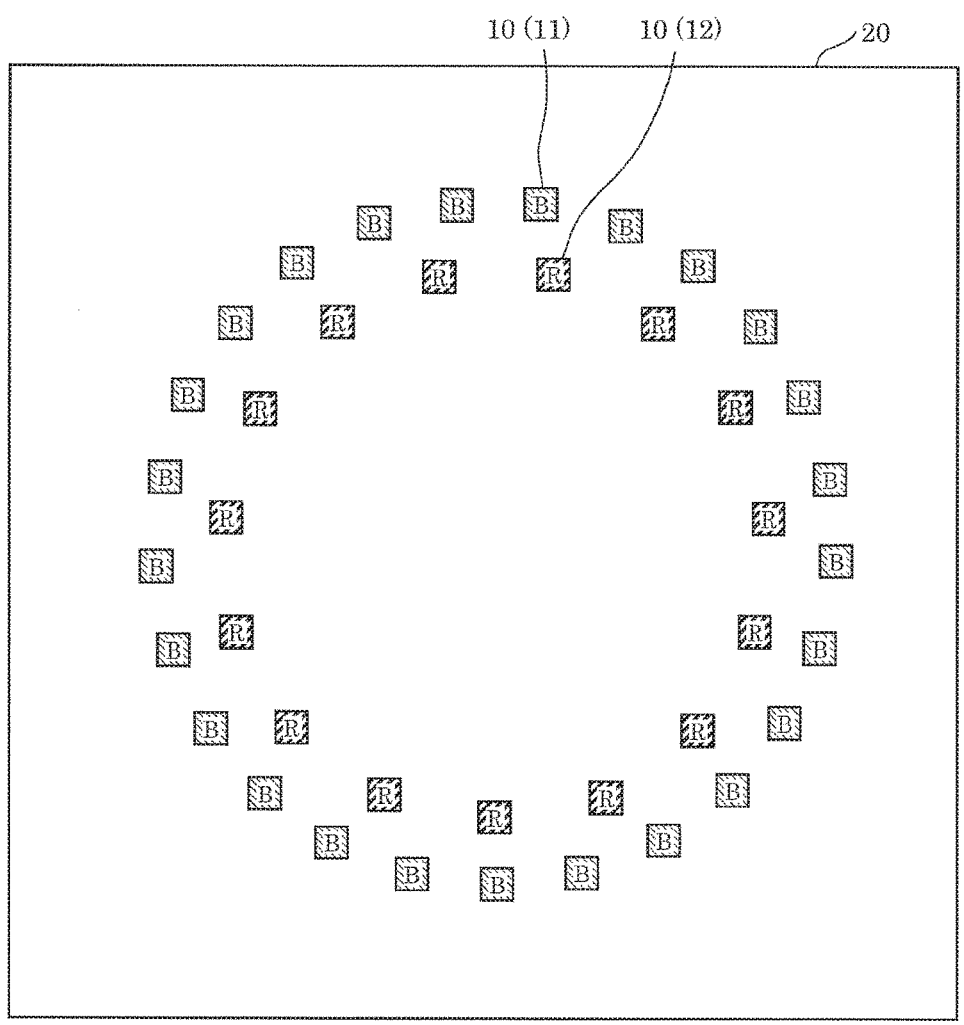
FIG. 11 is a plan view schematically illustrating a light-emitting device according to Variation 2.

For example, first light-emitting elements 11 and second light-emitting elements 12 may be arranged in first serial element group S1 and second serial element group S2 in such a way that they are electrically connected in the same pattern as in FIG. 1 while the layout thereof in plan view is the arrangement illustrated in FIG. 11. This example can be implemented through creativity in the routing of wiring (not illustrated in the Drawings) formed on substrate 20.

Although the COB light-emitting device using LED chips for first light-emitting element 11 and second light-emitting element 12 is provided in Embodiments 1 and 2 described above, this is not the only example. For example, an SMD (surface mount device) light-emitting device may be provided using, as first light-emitting elements 11 and second light-emitting elements 12, SMD LED elements formed by packaging LED chips one by one. In this case, first light-emitting element 11 includes, for example, a container made from a white resin with a cavity, a blue LED chip mounted in the cavity of the container, and a sealing member (a yellow phosphor-containing resin) filling the cavity of the container. Likewise, second light-emitting element 12 includes, for example, a container made from a white resin with a cavity, a red LED chip mounted in the cavity of the container, and a sealing member filling the cavity of the container.

Furthermore, although two types of light-emitting elements, first light-emitting element 11 and second light-emitting element 12, are used in Embodiments 1 and 2 described above, three or more types of light-emitting elements may be used. For example, in addition to first light-emitting element 11 (the blue LED chip) and second light-emitting element 12 (the red LED chip), a green LED chip that emits green light may be used. With this, it is possible to provide an RGB-type light-emitting device that emits white light by using three primary colors of light.

Furthermore, although the blue LED chip and the yellow phosphor are combined to generate white light in the light-emitting devices according to Embodiments 1 and 2 described above, the combination of an LED chip and phosphor for generating white light is not limited to the above examples. Specifically, a phosphor-containing resin that contains a red phosphor and a green phosphor may be used to generate white light in combination with the blue LED chip.

Furthermore, although the light-emitting devices according to Embodiments 1 and 2 are configured to emit white light, this is not the only example.

Furthermore, although phosphor is used as a wavelength converting material in Embodiment 1 and 2 described above, this is not the only example. For example, materials including a substance which absorbs a certain wavelength of light and emits light of a different wavelength, such as semiconductors, metal complexes, organic dyes, and pigments, may be used as the wavelength converting material.

Furthermore, although light-emitting element 10 is sealed with a sealing member in Embodiments 1 and 2 described above, the light-emitting element is not required to be sealed with a sealing member.

Furthermore, although Embodiment 3 described above shows an example in which the light-emitting devices according to Embodiments 1 and 2 are applied to a light source unit of a recessed light, this is not the only example. For example, the light-emitting devices according to Embodiments 1 and 2 described above may be used as a light source unit of a spotlight and may also be used as a light source unit of other lighting fixture such as a base light. Alternatively, the light-emitting devices according to Embodiments 1 and 2 described above can be applied to a lamp such as a bulb-shaped LED lamp or a straight tube LED lamp.

Furthermore, the light-emitting devices according to Embodiments 1 and 2 described above may be used as a light source of devices for other purposes than lighting purposes. For example, the light-emitting device can be used as a backlight light source of a liquid-crystal display device or the like, a lamp light source of a copier or the like, or a light source of an exit sign, signage, or the like.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light-emitting device comprising:
   a substrate; and
   a plurality of light-emitting elements disposed above the substrate and including first and second light-emitting elements, wherein
   rates of decrease in light outputs of the first and second light-emitting elements when temperature increases are different,
   the plurality of light-emitting elements further include:
   a first serial element group including some light-emitting elements connected in series among the plurality of light-emitting elements; and
   a second serial element group connected in parallel with the first serial element group and including some light-emitting elements connected in series among the plurality of light-emitting elements,
   a ratio of a total number of the first light-emitting elements and a total number of the second light-emitting elements in the first serial element group is different from a ratio of the total number of the first light-emitting elements and the total number of the second light-emitting elements in the second serial element group, and
   a total number of the light-emitting elements connected in series in the first serial element group is different from a total number of the light-emitting elements connected in series in the second serial element group,
   one of the first and second serial element groups contains both first and second light-emitting elements, and
   a total forward voltage in the first serial element group and a total forward voltage in the second serial element group are equal,
   wherein the first light-emitting element is a blue light emitting diode chip which emits blue light, and the second light-emitting element is a red light emitting diode chip which emits red light.

2. The light-emitting device according to claim 1, further comprising:
   a first seal which seals the first light-emitting element; and
   a second seal which seals the second light-emitting element,
   wherein the first seal contains a yellow phosphor.

3. The light-emitting device according to claim 1,
   wherein the first light-emitting element and the second light-emitting element are electrically connected in a periodic arrangement in each of the first serial element group and the second serial element group.

4. The light-emitting device according to claim 1,
   wherein the first light-emitting element and the second light-emitting element are mounted in a periodic arrangement in plan view.

5. An illumination apparatus comprising
   the light-emitting device according to claim 1.

6. The light-emitting device according to claim 1, wherein one of the first serial element group and the second serial element group includes only the first light-emitting element or only the second light-emitting element.

* * * * *